US005808913A

United States Patent [19]

Choi et al.

[11] Patent Number: 5,808,913

[45] Date of Patent: Sep. 15, 1998

[54] SIGNAL PROCESSING APPARATUS AND METHOD FOR REDUCING THE EFFECTS OF INTERFERENCE AND NOISE IN WIRELESS COMMUNICATIONS UTILIZING ANTENNA ARRAY

[75] Inventors: Seung Won Choi, Hanyang Apt 52-1111, Ssang-Moon 4 Dong, Do-Bong Gu, Seoul; Dong Un Yun, Kang-Won Do, both of Rep. of Korea

[73] Assignee: Seung Won Choi, Seoul, Rep. of Korea

[21] Appl. No.: 863,241

[22] Filed: May 27, 1997

[30] Foreign Application Priority Data

May 25, 1996 [KR] Rep. of Korea .................. 1996-17931

[51] Int. Cl.[6] .................................................. H03F 1/26

[52] U.S. Cl. .......................... 364/574; 379/406; 704/226; 704/479 B

[58] Field of Search ............................ 364/574; 379/410, 379/406, 411; 370/110.1; 704/226; 381/56; 342/379

[56] References Cited

U.S. PATENT DOCUMENTS 4,549,286 10/1985 Lang et al. .
5,371,506 12/1994 Yu et al. ................................ 342/379
5,410,595 4/1995 Parker et al. .......................... 379/410
5,485,552 1/1996 Solve et al. .............................. 381/56
5,574,824 11/1996 Siyh ....................................... 704/206

FOREIGN PATENT DOCUMENTS 809323 11/1997 European Pat. Off. ......... H01Q 3/26

*Primary Examiner*—James P. Trammell
*Assistant Examiner*—Kamini Shah
*Attorney, Agent, or Firm*—Merchant, Gould, Smith, Edell Welter & Schmidt

[57] ABSTRACT

The present invention provides a signal processing apparatus and method for enhancing the communication quality and increasing the communication capacity by reducing the effects of interference and noises with the nice beam pattern. And, the inventive signal processing apparatus and method introduce a simplified computational technique for generating the nice beam pattern having its maximum gain along the direction of the wanted signal and maintaining the gain toward the direction of the interfering signals in as low a level as possible.

31 Claims, 9 Drawing Sheets

SIGNAL PROCESSING APPARATUS AND METHOD FOR REDUCING THE EFFECTS OF INTERFERENCE AND NOISE IN WIRELESS COMMUNICATIONS UTILIZING ANTENNA ARRAY

FIELD OF THE INVENTION

This invention relates to a signal processing technique for wireless communication systems, and more particularly to a signal processing apparatus and method for reducing the effect of interference and noise by controlling beam patterns in real-time, in a communication system utilizing an antenna array.

BACKGROUND OF THE INVENTION

In general, an original signal transmitted by a certain transmitter (hereinafter, simply called a "wanted signal") is always received at a receiving set together with other plural interfering signals.

Since the level of distortion in a telecommunication system is determined by the ratio between the power of the wanted signal and total power of all the interfering signals, even if the level of the wanted signal is much higher than each of the interfering signals, the distortion of the communication system can pose a serious problem when the total power of all the interfering signals proportionally increased according to the number of the interfering signals is rather high. In conventional telecommunication systems, interfering signals make it very difficult to extract the information from the wanted signal.

Although an antenna array system has been considered as a countermeasure to improve the problems caused by the interfering signals, no practical method of synthesizing the antenna array system in actual telecommunication systems, particularly for mobile communication systems, has yet been suggested. The problems of applying conventional antenna array systems, which is based on the method of Eigen-Decomposition, is mainly due to its complexity and operating speed which is too large for real-time processing in telecommunication systems.

The conventional technique about the antenna array system was introduced in the following references:

[1] M. Kaveh and A. J. Barabell, "The Statistical Performance of the MUSIC and Minimum-Norm Algorithms for Resolving Plane Waves in Noise," IEEE Trans., Acoust., speech and signal process., vol. ASSP-34, pp. 331–341, April 1986.

[2] T. Denidni and G. Y. Delisle, "A Nonlinear Algorithm for Output Power Maximization of an Indoor Adaptive Phased Array," IEEE Electromagnetic Compatibility, vol. 37, no. 2, pp. 201–209, May, 1995.

[3] B. G. Agee, S. V. Schell, and W. A. Gardner, "Spectral Self-Coherence Restoral: A New Approach to Blind Adaptive Signal Extraction Using Antenna Arrays", Proc. of IEEE, Vol. 78, No. 4, pp. 753–767, April 1990.

The problems in most conventional methods of designing antenna array system are, first, it, (except the method introduced in [3]), require some knowledge about the location of the wanted signal apriori, and second, it requires so many computations that the real-time processing cannot be performed. Especially, when the arrival angle of the wanted signal or the total number of signal sources is unknown, the required amount of computation becomes even larger, which makes it impossible to apply the conventional method of synthesizing the antenna array system to a practical signal environment, such as mobile communications. Another undesirable feature of most conventional methods of designing antenna array systems is that the performance and/or the complexity of the system to be built is affected by the coherence and/or cross correlation of the wanted signal with respect to the interfering signals. This means that the antenna array system often requires additional complexities when the signals are fully or partially coherent so that the resultant system becomes too complicated for real-time processing, which is very important, especially in mobile communications. Another conventional methods such as the one shown in [3], does not work at all if the wanted signal cannot be extracted from the interfering signals with a particular frequency separation at a proper time lag.

This invention introduces a new signal processing technology of designing an antenna array system that provides for a nice beam pattern having its maximum gain along the direction of the wanted signal maintaining the gain along the direction of interfering signals in a relatively much lower level. Under an assumption that the wanted signal is sufficiently larger in magnitude than each interfering signals, the proposed technique generates the desired beam pattern without requiring any knowledge about the wanted signal as well as the interfering signals.

Another important and attractive aspect of the proposed technique is that the total required amount of computation is so small that the optimal parameters of the antenna array system are produced on a real-time basis. In fact, the signal processing apparatus, which forms the beamforming module of the antenna array system introduced in this invention, can easily be implemented with a normal, off the shelf digital signal processor.

The primary objective of this invention is to introduce a new method of designing a signal processing apparatus, i.e., the beamforming module of an antenna array system, in order to apply it at the base station of a mobile communication system for receiving and transmitting the signal of each subscriber in a cell with a nice beam pattern which is provided individually for each subscriber of the cell. The proposed technique can also be applied in other signal environments such as WLL(wireless local loop) and other fixed communications as well as mobile communications.

SUMMARY OF THE INVENTION

It is an object of the present invention to provide a signal processing apparatus and method for enhancing the communication quality and increasing the communication capacity by reducing the effects of interference and noises with the nice beam pattern.

And, the inventive signal processing apparatus and method introduce a simplified computational technique for generating the nice beam pattern having its maximum gain along the direction of the wanted signal and maintaining the gain toward the direction of the interfering signals in as low a level as possible.

To accomplish the object of the present invention, there is disclosed a signal processing apparatus for minimizing interference and for reducing effects of noise by controlling beam patterns of a telecommunication system having an antenna array, comprising: a means for computing a parameter, gamma ($\gamma(k)$), by utilizing a predetermined adaptive gain ($\mu$), a signal vector ($x(t)$), each element of which is obtained from received signals at a corresponding antenna element and a final array output signal ($y(t)$) at the present snapshot and a means for updating a gain vector ($w$) by utilizing said gamma ($\gamma(k)$), the present value of said gain vector (w), said adaptive gain ($\mu$), said signal vector (x(t)) and said final array output(y(t)).

In another aspect of the present invention, there is disclosed a signal processing method for minimizing interference and reducing effects of noise by controlling beam patterns of a telecommunication system having an array antenna, comprising the steps of: (a) computing gamma ($\gamma$) by utilizing said adaptive gain ($\mu$), said signal vector (x) and said final array output signal (y) at the present snapshot; and (b) updating gain vector (w) by utilizing said gamma, the present value of said gain vector, said adaptive gain, said signal vector and said final array output.

In another aspect of the present invention, there is disclosed a signal processing apparatus for minimizing interference and for reducing effects of noise by controlling beam patterns of a telecommunication system having an array antenna, comprising: a means for generating an autocorrelation matrix (R) of received signals by utilizing said signal vector (x) at every snapshot; a means for computing said gamma ($\gamma$) by utilizing said adaptive gain ($\mu$), the present value of said gain vector (w) and said autocorrelation matrix (R) at each snapshot; and a means for updating said gain vector (w) by utilizing said gamma ($\gamma$), the present value of said gain vector (w), said adaptive gain ($\mu$) and said autocorrelation matrix (R).

Also, in another aspect of the present invention, there is disclosed a signal processing method for minimizing interference and for reducing effects of noise by controlling beam patterns of a telecommunication system having an array antenna, comprising the steps of: (a) generating an autocorrelation matrix (R) of received signals by utilizing said signal vector (x) at every snapshot; (b) computing gamma ($\gamma$) by utilizing said adaptive gain ($\mu$), the present value of gain vector (w) and autocorrelation matrix (R) at each snapshot; and (c) updating said gain vector (w) by utilizing said gamma ($\gamma$), the present value of said gain vector (w), said adaptive gain ($\mu$) and said autocorrelation matrix (R).

BRIEF DESCRIPTION OF THE DRAWINGS

The novel features believed characteristic of the invention, as well as other features and advantages thereof, will best be understood by reference to the following detailed description of a particular embodiment, read in connection with the accompanying drawings, wherein.

DETAILED DESCRIPTION OF THE PREFERRED EMBODIMENT

Figure 1:
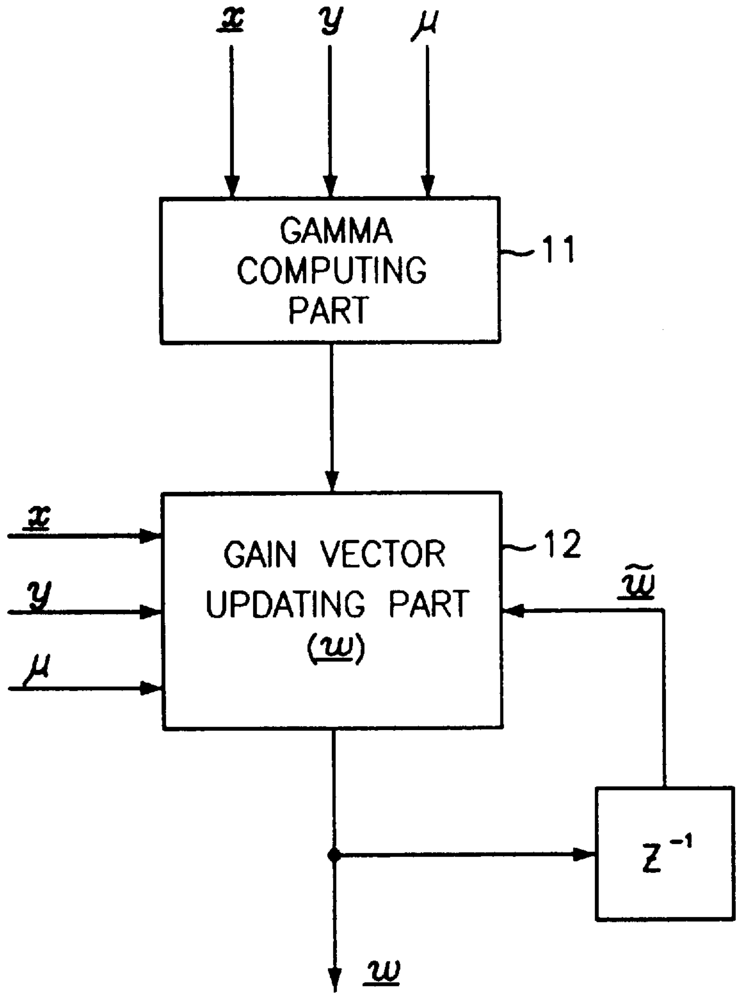
FIG. 1 is a block diagram of the signal processing apparatus according to the first embodiment of the present invention.

A preferred embodiment of the present invention will be explained below with reference to the accompanying drawings.

The signal processing apparatus that is proposed in this invention generates a beam pattern having its maximum gain along the direction of the wanted signal maintaining the gain to the other directions in as low a level as possible. This can be accomplished by one of two approaches.

The first approach is to optimize the value of the complex gain that is to be multiplied to each signal received at each antenna element, and the other approach is to optimize the value of the phase delay that is to be added to each signal received at each antenna element. Since each element of the gain vector in the first approach is to be weighted (multiplied) to each element of the signal vector, the gain vector is often referred to as the "weight vector" as well.

Only the first approach is explained in detail in this document because of the following two reasons: first, these two approaches are mathematically equivalent, second, the second approach is more costly in hardware and the beamforming performance of the second approach is inferior to the first one in terms of angle accuracy. However, the second approach can easily be implemented by utilizing the procedure explained in this invention. Therefore a signal processing apparatus or signal processing method that is implemented in the second approach should be a part of this invention as long as it utilizes the idea introduced in this document.

In other words, this invention determines the complex gain vector "w" in such a way that the desired beam pattern be formed, and as a result the output of the array antenna system, i.e., the Euclidean inner product of the signals induced at the antenna elements and the complex gain vector, should be as close to the wanted value as possible.

If the magnitude of every element of the complex gain vector is normalized to 1, multiplying the signal received at each antenna element by the corresponding element of the complex gain vector w is equivalent to adding the phase delay to the signal by the amount of the phase term of each corresponding element of the complex gain vector. Therefore, multiplying the signal vector by the gain vector is equivalent to adding the phase of the signal vector by the amount of the phase term of the gain vector.

As mentioned above, the same effect can also be obtained by appending the time delay to the signal received at the i_th antenna element by the amount of $\phi_i$ divided by $2\pi f_c$, where $\phi_i$ and $f_c$ denote the phase delay to be added to the signal received at the i_th antenna element and the carrier frequency, respectively.

For a linear array system having a uniform spacing of $\lambda_c/2$ between adjacent antenna elements, where $\lambda_c$ denotes the wavelength at the carrier frequency, the signal induced at the m_th antenna element can be represented after the frequency down conversion as follows:

$$x_m(t) = \sum_{k=1}^{M} S_k(t)\, e^{j(m-1)\pi \sin\theta_k} + n_m(t) \tag{1}$$

where $\theta_k$ denotes the incident angle of the k_th signal and $S_k(t)$ is the k_th transmitted signal observed at the receiving end.

The subscript m in equation (1) represents the antenna element. The reference antenna element is assigned to be m=1 and the other antenna elements are assigned the next numbers, i.e., m=2, 3, . . . , in the order of the magnitude of the phase of the signal induced at each antenna element.

In eq. (1), one of the M signals is the wanted signal. For example, when the $S_1(t)$ is the wanted signal, the $S_1(t)$ must be received at the antenna array system while all the other M−1 signals, i.e., $S_2(t)$, $S_3(t)$, . . . , $S_M(t)$, are interfering signals to be rejected together with the noise $n_m(t)$ for a good signal reception.

Although eq. (1) is valid for the linear array with the uniform half-wavelength spacing, the technique provided in this invention can be generally applied to non-uniform spacing or non-linear array systems as well.

For non-uniform spacing arrays, if the distance of the m_th antenna element from the reference antenna element is $d_m$, then there exists a phase difference in the signal induced at the m_th antenna element by $$2\pi\frac{d_m}{\lambda_c}\sin\theta_k$$

compared to the phase of the signal at the reference antenna element. Thus, the signal induced at the m_th antenna element for non-uniform and/or non-linear array systems can be written as follows:

$$x_m(t)=\sum_{k=1}^{M}S_k(t)\,e^{j2\pi\frac{d_m}{\lambda_c}\sin\theta_k}+n_m(t).$$

In this invention, in order to make the phase delay to be appended to each antenna element be a positive quantity, the reference antenna element is defined as the antenna element at which the induced signal has the latest phase in the receiving array. In the transmitting array system, therefore, the antenna element at which the induced signal has the earliest phase is the reference antenna element.

Defining the reference antenna element in the way explained above, the array antenna system can easily be designed by appending the zero phase delay to the signal at the reference antenna element and the proper positive amount of the phase delay to the signal at the other antenna elements.

For an array antenna system consisting of N antenna elements, the array receives the N-by-1 signal vector at every snapshot. The autocorrelation matrix of the received signals can be written as shown in eq. (2).

The term "snapshot" in this document denotes the time period during which the new gain vector (or, phase delay vector) is computed upon receiving the new signal vector. In this invention, the array antenna system that adapts to the new signal vector can be designed at each snapshot by determining the proper gain vector (or, phase delay vector) for each new signal vector received at every snapshot.

$$\underline{R}_x(J)=\frac{1}{J}\sum_{I=1}^{J}\underline{x}(t+1T_S)\underline{x}^H(t+1T_S)\tag{2}$$

where the underlined quantities denote the vector or matrix, $T_s$ is the snapshot period and superscript H is the Hermitian operator. The N-by-1 signal vector x(t) of which the number of elements is N, consists of the received signal $x_m(t)$ for m=1, 2, . . . , N, which is explained in eq. (1) as follows:

$$x(t)=[x_1(t)x_2(t)\ldots x_N(t)]^T\tag{3}$$

where superscript T denotes the transpose operator.

However, eq. (2) is valid only when the arrival angles of all the signal components remain unchanged. In a time-varying environment where each signal source moves during the communication, as in the mobile communication environment, the autocorrelation matrix cannot be obtained by eq. (2) because the arrival angle of the signal source changes at every snapshot.

Therefore, in time-varying signal environments, it is recommended that the autocorrelation matrix be computed in an iterative manner as follows:

$$R_x(J+1)=f\cdot R_x(J)+x((J+1)T_S)x^H((J+1)T_S)\tag{4}$$

where $R_x(J+1)$ and $R_x(J)$ denote the autocorrelation matrix at the J+1st and J_th snapshot, respectively, and f denotes the forgetting factor in the range between 0 and 1.

Since communication environments, especially mobile communications, are generally time-varying environments, the autocorrelation matrix in this invention is computed by eq. (4) rather than eq. (2).

From various computer simulations, it is recommended to set the value for the forgetting factor, f, in the range between 0.8 and 0.99 for optimal performances in land mobile communications.

Hereinafter, the design of the optimal array antenna system will be explained in more detail by taking the practical examples of the actual applications.

The eigenvalues $\{\lambda_i\}$ of the autocorrelation matrix, determined by eq. (2) or (4), can be sorted by the magnitude as $\lambda_1\geqq\lambda_2\geqq\ldots\geqq\lambda_N$. The largest eigenvalue $\lambda_1$ is determined by the signal components, not the noise components, regardless of the number of signal sources or antenna elements.

Therefore, the eigenvector corresponding to the largest eigenvalue $\lambda_1$ exists in the signal subspace as follows:

$$\underline{e}=\sum_{i=1}^{M}\xi_i\underline{a}(\theta_1)\tag{5}$$

where the complex quantity $\xi_i$ is a constant determined by the magnitudes and distribution of the wanted and interfering signals, and the vector a(θi) is the steering vector of the i_th signal component in the following form:

$$a(\theta i)=[1e^{j\pi sin\theta i}\ldots e^{j(N-1)\pi sin\theta i}].\tag{6}$$

Now, suppose the magnitude of the wanted signal is sufficiently larger than each of the interfering signals such that the condition shown in (7) is satisfied.

$$|S_1(t)|>>|S_i(t)|\text{for } i\neq 1\tag{7}$$

In a signal enviroment in which condition (7) is satisfied, the eigenvector $\lambda_1$ corresponding to the largest eigenvalue can approximated as:

$$e_1=\xi_1 a(\theta_1).\tag{8}$$

This means that the steering vector, a $(\theta_1)$, of the wanted signal is almost the same as the eigenvector corresponding to the largest eigenvalue except that the complex-valued constant, $\xi_1$, is multiplied.

Therefore, under the condition that the wanted signal is sufficiently larger than each of interfering signals, the maximum gain of the array antenna system will approximately point to the direction of the source of the wanted signal if the gain vector to be appended to the antenna elements of the array system is determined by the eigenvector corresponding to the largest eigenvalue of the autocorrelation matrix of the signals impinging upon the array system.

In conclusion of the above discussions, this invention suggests that the gain vector can be determined by the following equation:

$$\underline{w} = \frac{1}{\sqrt{N}} \underline{e}_1. \tag{9}$$

Now, the practical way of computing the optimal weight vector will be presented.

As mentioned previously, under a particular signal enviroment where the wanted signal is sufficiently larger than each of interfering signals, an array antenna system having the desired beam pattern, which provides the maximum gain along the direction of the wanted signal source, can be obtained by taking the weight vector w with the normalized eigenvector $e_1$ corresponding to the largest eigenvalue $\lambda_1$ of the autocorrelation matrix.

However, to obtain the autocorrelation matrix itself requires a lot of computations, as shown in eqs. (2) and (4). Moreover, it is not a simple task to compute the eigenvector corresponding to the largest eigenvalue of the matrix. What makes the problem even more complicated is that the arrival angle of each signal changes at every snapshot in mobile communications such that the eigenvector to be obtained varies at every snapshot.

Considering the above-mentioned difficulties, this invention introduces a method of computing the weight vector w with the approximated value for the eigenvector $e_1$ in an iterative way. This means that the weight vector w is computed by updating the solution of the previous snapshot through the iterative means as follows:

$$w(k+1)=w(k)+\rho(k)v(k) \tag{10}$$

where the independent variable k is the time index representing the snapshot number, and ρ (k) and v(k) are the adaptive gain and search direction vector, respectively. Note that the gain vector w(k+1) shown in equation (10) should be normalized at each snapshot to make the magnitude of the gain vector be 1.

From equation (10), it is observable that the solution at the present snapshot can be obtained by updating the solution of the previous snapshot in the direction indicated by v(k) by the amount indicated by ρ (k)

In order to compute the solution for the gain vector in the iterative manner mentioned above, however, the answers for the following two questions must be satisfied:

First, how do we set the initial value of the gain vector w(0) in the beginning?

Second, how do we set the adaptive gain ρ (k) and the search direction vector v(k) at each snapshot?

In this invention, the initial value of the gain vector w(0) is determined from the received signal vector x(0) as follows:

$$\underline{\omega}(0) = \frac{x(0)}{x_1(0)} \tag{11}$$

where $x_1(0)$, i.e., the first element of the signal vector x(0), is the signal induced at the reference antenna element at the very first snapshot.

The reason why the vector w(0) can be determined by the equation (11) is that the received signal vector itself x(0) must be a good approximation for the searching eigenvector because the rank of the matrix at the initial snapshot is 1, such that the number of the distinct nonzero eigenvalue is only 1, which must correspond to the signal received at the very first snapshot if the signal to noise ratio (SNR) is reasonably high.

It is recommended that the magnitude of the adaptive gain ($\mu$) does not exceed the reciprocal of N times of the average power of the input signals, in order for the entire procedure of designing the antenna array system to converge, where N denotes the number of antenna elements.

Starting from the initial value shown in (11), this invention introduces a new technique of designing the antenna array system by updating the weight vector in the manner shown in equation (10). As mentioned previously, the key parts in updating the weight vector, as shown in equation (10), is to determine the search direction vector v(k) and the adaptive gain ρ (k).

In order to find the search direction vector, let's consider a cost function defined as follows:

$$f(w)=w(k)^H R_x w(k)+\gamma(1-w(k)^H w(k)) \text{ with constraint } |w(k)|^2=1. \tag{12}$$

As can be verified mathematically, the maximum eigenvalue of the autocorrelation matrix $R_x$ can be obtained by finding the maximum value of the functional (12), and the vector w corresponding to the maximum value of the functional (12) is an eigenvector corresponding to the maximum eigenvalue of the matrix $R_x$.

Since the gain vector w of the antenna array system should be determined by the eigenvector corresponding to the maximum eigenvalue in order to form a nice beam pattern having its maximum gain along the direction of the target signal source, a search direction vector that maximizes the cost function (12) is to be found.

The desired search direction vector described above can be obtained by setting the gradient of the function (12) with respect to the weight vector to be zero as follows:

$$\nabla=2R_x w-2\gamma w=0. \tag{13}$$

In order to compute the gain vector satisfying equation (13) in an iterative manner as shown in equation (10), the search direction vector v(k) is set utilizing the result of equation (13) as follows:

$$\begin{aligned} \underline{w}(k+1) &= \underline{w}(k) + \frac{1}{2}\mu\underline{\nabla} = \underline{w}(k) + \mu\underline{v}(k) \\ &= \underline{w}(k) + \mu[\underline{R_x}(k)\underline{w}(k) - \gamma(k)\underline{w}(k)] \\ &= [(1-\mu\gamma(k))\underline{I} + \mu\underline{R}]\underline{w}(k). \end{aligned} \tag{14}$$

It can be observed from equation (14) that the value for gamma γ should be computed at each snapshot in order to obtain the gain vector w. The optimal value for gamma can be computed by substituting equation (14) into the constraint of equation (12) to result in the following expression for gamma:

$$\gamma^2(k)-2[1/\mu+w^H(k)R_x(k)w(k)]\gamma(k)+w^H(k)R_x^{\,2}(k)+2/\mu w^H(k)\,R_x(k)w(k)=0. \tag{15}$$

Putting two terms of equation (15) as follows $$a=[1/\mu+w^H(k)R_x(k)w(k)],$$

$$b=w^H(k)R_x^{\,2}(k)w(k)+2/\mu w^H(k)\,R_x(k)w(k),$$

the value for gamma satisfying equation (15) can be obtained as $\gamma(k)=a\pm\sqrt{a^2-b}$. The smaller value for gamma is selected as follows:

$$\gamma(k) = a - \sqrt{a^2 - b}\ . \tag{16}$$

The entire procedure of computing the gain vector can be summarized as follows:

At the initial stage, the gain vector is set with the signal vector at the very first snapshot as $w(0)=x(0)/x_1(0)$. The initial autocorrelation matrix is also set with the initial signal vector as $R_x(0)=x(0)x^H(0)$.

As the snapshot continues, the autocorrelation matrix is updated upon the reception of a new signal vector based on equation (4). The value for gamma and gain vector are obtained according to equations (16) and (14), respectively. The update of the autocorrelation matrix, gamma, and gain vector is repeated with the new signal vector at every snapshot.

According to the technique presented in this invention, the entire procedure of computing the gain vector and obtaining the final array output with the computed gain vector at each snapshot is tremendously simplified. The simplification of the proposed method is mainly due to the fact that the technique disclosed in this invention does not require any apriori information regarding the location of the target signal source or interfering signal sources. Consequently, the proposed technique makes it possible to perform real-time processing of reception and transmission of the signals in most practical signal environments, such as mobile communications, by utilizing an ordinary, off the shelf digital signal processor (DSP).

In fact, as shown in equations (4), (13) and (15), the total computational load for obtaining the gain vector is about $O(2N^2+6N)$ at each snapshot. It has been confirmed in various computer simulations that the computational load of $O(2N^2+6N)$ is small enough to perform real-time processing of computing the gain vector and finally generating the array output utilizing a general-purpose DSP as long as the relative speed of the transmitter and receiver does not exceed 150km/h, as in land mobile communication.

Although the amount of computation of the proposed technique has been reduced tremendously compared to the conventional methods, the complexity of this procedure increases in the second order of N, as the number N of antenna elements increases. The main reason for this is that the procedure includes the matrix operations.

This invention discloses another technique of reducing the required amount of computation by setting the forgetting factor in computing the autocorrelation matrix with a particular value.

Suppose the forgetting factor in equation (4) is set to be 0. This particularly means that the autocorrelation matrix is computed only with the instantaneous signal vector at each snapshot. Then, the entire procedure presented previously is much more simplified.

As a matter of fact, when the incident angle of the input signal varies significantly at each snapshot, it is not useful to consider the signal vector of the previous snapshots in computing the autocorrelation matrix.

First, the computation of the autocorrelation matrix is simplified as follows:

$$R_x(J) \approx x(J)x^H(J). \qquad (19)$$

Substituting equation (19) into equations (13) through (15), the update of the search direction vector, gamma and gain vector is also simplified, respectively, as follows:

$$\underline{v}(k) = y^*(k)\underline{x}(k) - \gamma(k)\underline{w}(k),$$

$$\gamma(k) = a - \sqrt{a^2 - b}\ , \qquad (20)$$

$$\text{where, } a = \frac{1}{\mu} + |y(k)|^2,\ b = |y(k)|^2\left[\ \|\underline{x}(k)\|^2 + \frac{2}{\mu}\ \right], \text{ and}$$

$$\underline{w}(k+1) = \underline{w}(k) + \mu\underline{v}(k) = [1 - \mu\gamma(k)]\underline{w}(k) + \mu y^*(k)\underline{x}(k). \qquad (21)$$

Note that y(k) is the array output at the k¯th snapshot, which is defined as $y(k)=w^H(k)\ x(k)$.

As shown in equation (21), if the forgetting factor is fixed at zero, then, since the matrix is determined by the signal vector of the present snapshot only, the procedure of computing the optimal weight vector is considerably simplified. Moreover, the computation of the matrix at each snapshot is not needed at all, which means the calculation of equation (4) vanishes out of the entire procedure.

From the numerical results obtained in the computer simulations, the proposed method, which accounts for the last previous signal vectors as well as for the present signal vector for computing the autocorrelation matrix at each snapshot, provides about a 12–15 dB improvement in SIR (signal-to-interference ratio), whereas the noise power is reduced by the number of antenna elements, i.e., the SNR (signal-to-noise ratio) is increased by the factor of N.

On the other hand, the other method, which uses only the instantaneous signal vector at each snapshot, provides almost the same amount of improvement according to the noises, while about a 10–12 dB improvement is obtained in terms of the SIR (signal-to-interference ratio)

Consequently, the simplified version of the proposed method, which uses the signal vector at the present snapshot only, causes a degradation in SIR performance by about 2–3 dB compared to the original version of the proposed method which uses the signal vectors of the previous snapshots as well as the current signal vector in computing the autocorrelation matrix. However, since the complexity of the entire procedure is tremendously reduced, a simplified version would cause a much easier implementation and cost reduction.

Designing the array antenna system utilizing a simplified method, all the operations requiring the computational load of $O(N^2)$ disappear and the total computational load of the entire procedure becomes about 7N+16 additions and 4N+7 multiplications.

In order to implement the total system, which encounters both receiving and transmitting modes, the optimal weight vector computed during the receiving mode can be applied to obtain the optimal parameters for the transmitting mode.

As mentioned previously, when the proposed signal processing apparatus, which provides the desired beam pattern, is adopted at the cell-site antenna system, we can achieve not only an increase of the channel capacity and an enhancement of the communication quality but also a considerable extension of the battery's life with each subscriber in the cell.

An extension of the battery's life with each subscriber can be achieved because the cell-site antenna system adopting the proposed beamforming technique provides much better communication efficiency by generating the main lobe along the direction of the wanted signal source compared to the conventional cell-site antenna system.

Therefore, it is possible to perform an acceptable communication even with much less transmitting power at each subscriber's end. To reduce the transmitting power at each subscriber directly causes the life extension of the battery at each of the subscribers.

Now, an explanation of the proposed apparatus and method in more detail will follow by taking practical examples.

EMBODIED EXAMPLE 1

In this embodied example, a signal processing apparatus is introduced which computes the gain vector in real-time in order to generate the optimal beam pattern at the telecommunication system that employs the array antenna system. In this example, the autocorrelation matrix is updated with the instantaneous signal vector at each snapshot based on (19). Therefore, the autocorrelation matrix is actually not computed. As mentioned previously, the gain vector is obtained from equation (21). The implementation of the signal processing apparatus is explained in detail as the first embodied example as follows.

FIG. 1 is a block diagram of the signal processing apparatus according to an embodiment of the present invention.

As illustrated in the FIG. 1, the signal processing apparatus according to the first embodiment of the present invention comprises a gamma computing part 11 for computing the gamma (γk)) and a gain vector updating part 12 for updating the gain vector (w).

The gamma computing part 11 synthesizes the gamma (γ(k)) by using a predetermined adaptive gain ($\mu$), a signal vector (x(t)), each element of which is obtained from the received signal at the corresponding antenna element, and a final array output signal (y(t)) at the present snapshot.

The gain vector updating part 12 updates the gain vector (w) by utilizing the gamma (γ(k)), the present value of the gain vector (w), the adaptive gain ($\mu$), the signal vector(x(t)) and the final array output (y(t)) at the present snapshot.

Figure 5:
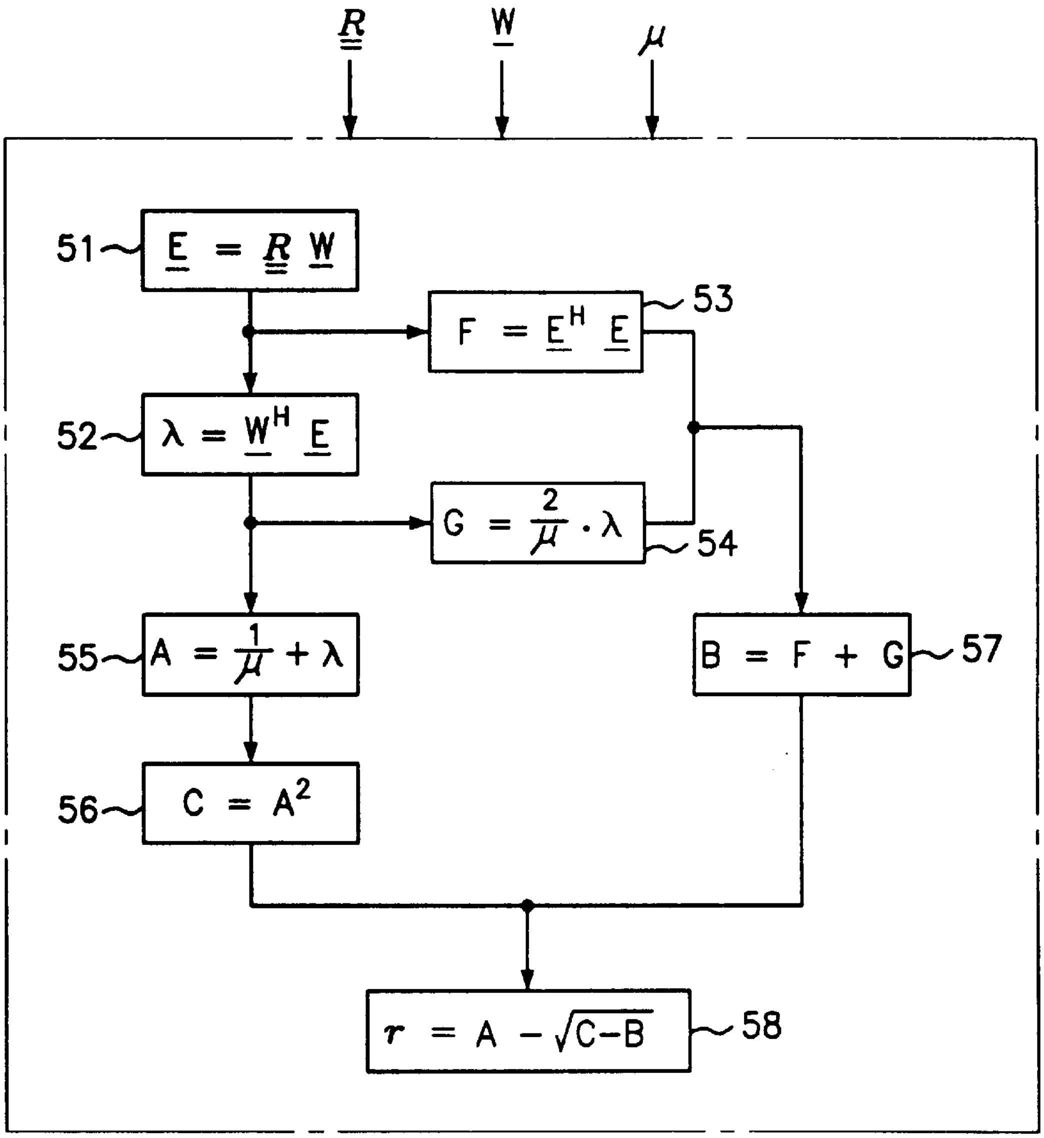
FIG. 5 is an example of the specified structure of the gamma-computing part shown in FIG. 4.

Each part described above can be implemented in a form of software in a computing system as well as in a form of hardware that is properly designed according to the procedures given in this invention. The ultimate goal of the signal processing apparatus is to generate the gain vector (w) providing the optimal beam pattern for the telecommunication system that employs the array antenna to produce the final array output signal (y(t)) by computing the inner product between the signal vector received at the present snapshot and the gain vector (w). The details of computing the inner product is shown in FIG. 5.

Figure 2:
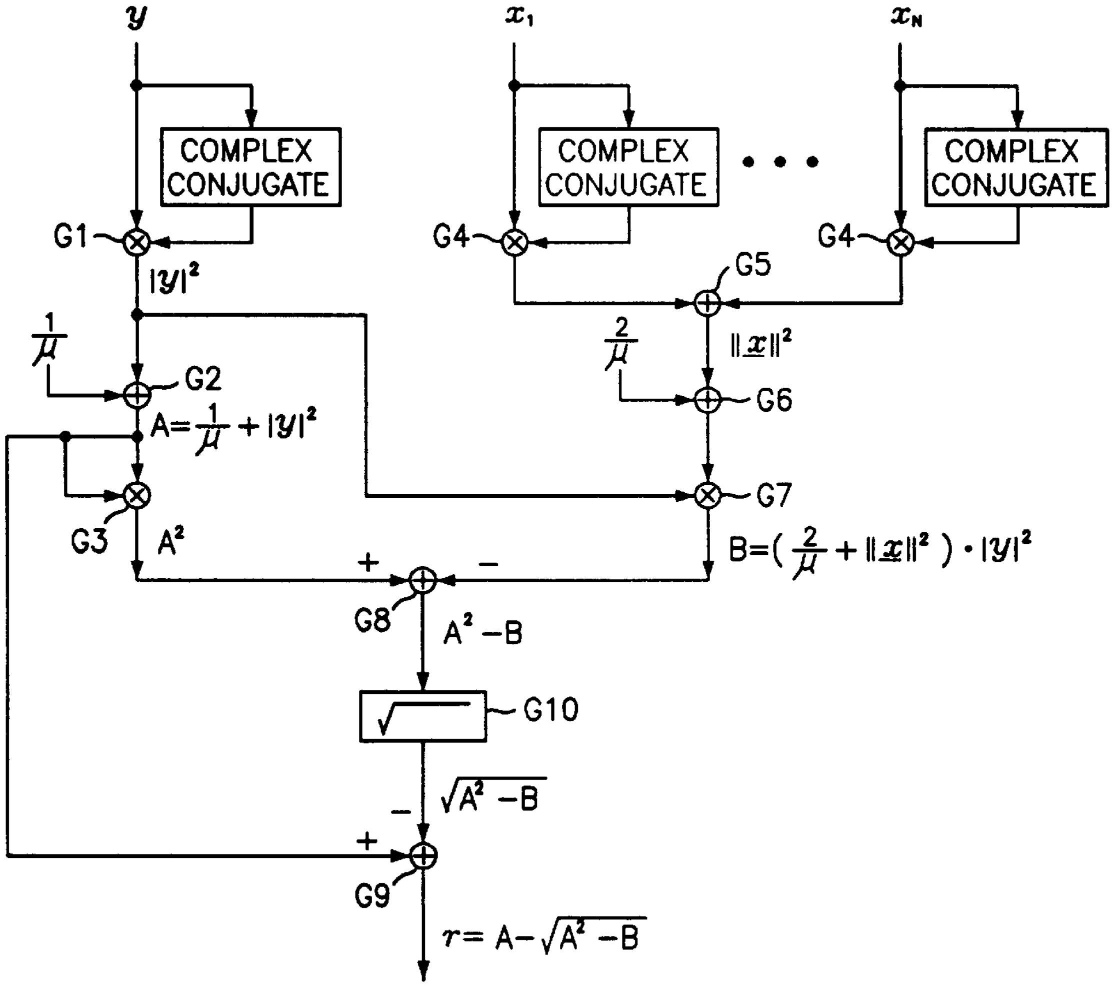
FIG. 2 is an example of the specified structure of the gamma-computing part shown in FIG. 1.

FIG. 2 illustrates an example of the specified structure of the gamma computing part 11, which is a part of the signal processing apparatus shown in FIG. 1.

As shown in FIG. 2, the gamma computing part 11 comprises the following parts: a multiplying part G1 for computing the squared value of the magnitude of the final array output (y(t)); an adding part G2 for adding the result of said multiplying part G1 to the reciprocal ($1/\mu$) of said adaptive gain; a multiplying part G3 for computing the squared value of A, where A denotes the result of said adding part G2; a plurality of multiplying parts G4 for computing the squared value of the magnitude of each element of said signal vector(x); an adding part G5 for adding up all the results of said multiplying parts G4; an adding part G6 for adding the result of said adding part G5 to two-times ($2/\mu$) of the reciprocal ($1/\mu$) of said adaptive gain ($\mu$); a multiplying part G7 for multiplying the result of said adding part G6 by the result ($|y|^2$) of said multiplying part G1; an adding part G8 for subtracting B from the result $A^2$ of said multiplying part G3 where B denotes the result of said multiplying part G7; a part G10 of computing a square root for generating the square root of the result of said adding part G8; and an adding part G9 for subtracting the result of said square-root-computing part G10 from the result of said adding part G2.

The above-described parts can be implemented by means of software in a computing system or by means of hardware.

The entire procedure can be summarized on a step-by-step basis as follows.

The squared value of the magnitude of said final array output is obtained (first step) . The reciprocal ($1/\mu$) of said adaptive gain ($\mu$) is added to the result of G1 (second step) . The squared value of A is computed, where A denotes the result of G2 (third step) . The squared value of the magnitude of each element of said signal vector (x) is computed (fourth step). All the results of G4 are added up (fifth step) . The result of G5 is added to two-times the reciprocal of said adaptive gain ($\mu$), i.e., ($2/\mu$)(sixth step). The result of the procedure of G6 is multiplied by the result ($|y|^2$) of G1 (seventh step). B is subtracted from the result ($A^2$) of G3 where B denotes the result of G7 (eighth step). The square root of the result of G8 is computed (ninth step) . And the result of G9 is subtracted from the result of G2, and thus, the resultant value of said gamma is produced as $\gamma=A-\sqrt{A^2-B}$ (tenth step).

Through the procedures presented above, the resultant gamma can also be viewed as $\gamma=A-\sqrt{A^2-B}$ where A and B denote $1/\mu+w^HR\ w$ and $w^HR^2w+2/\mu w^HR\ w$, respectively, with R being the autocorrelation matrix.

Figure 3A:
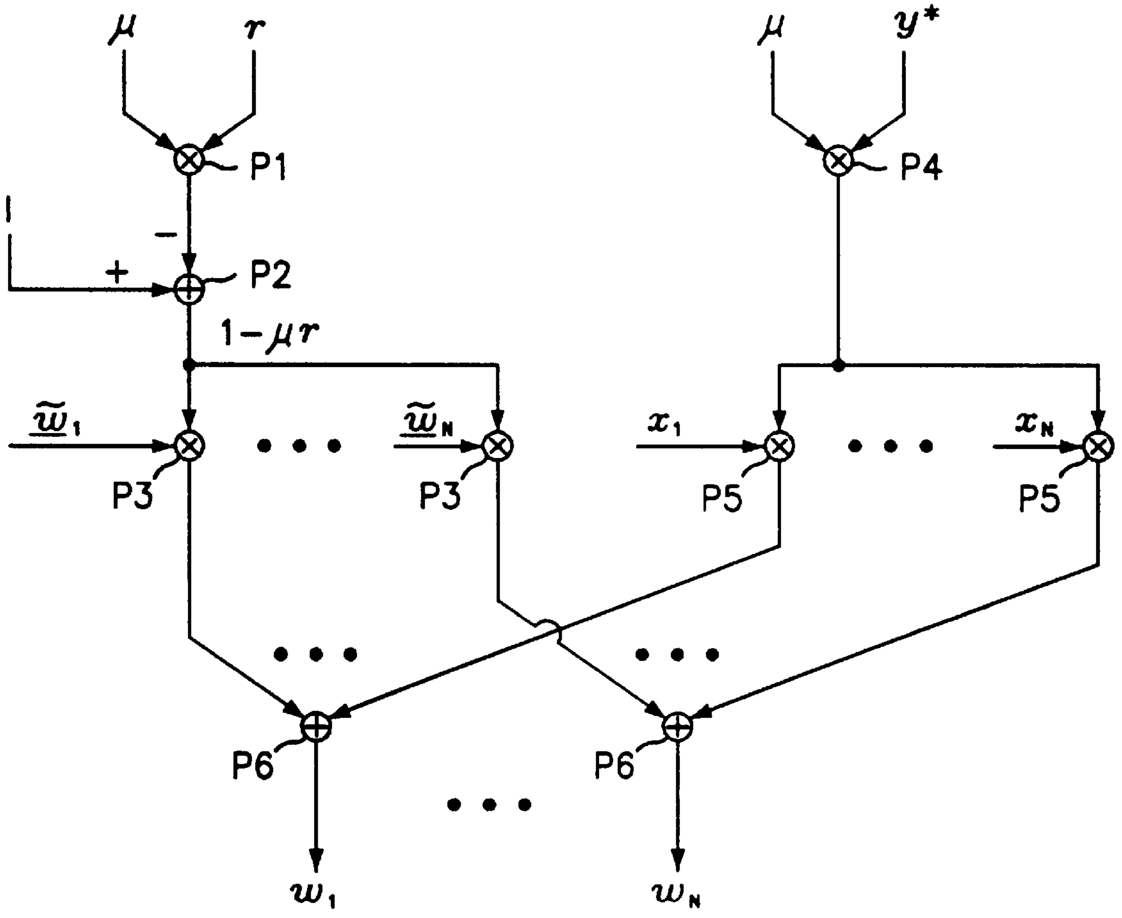
FIG. 3A is an example of the specified structure of the gain vector updating part shown in FIG. 1.

FIG. 3*a* illustrates an example of the specified structure of the gain vector updating part 12, which is a part of said signal processing apparatus shown in FIG. 1.

As shown in FIG. 3*a*, the gain vector updating part comprises the following procedures: a multiplying part P1 for multiplying said gamma γ by said adaptive gain $\mu$; an adding part P2 for subtracting the result of said multiplying procedure P1 from 1; a plurality of multiplying parts P3 for multiplying the present value of each element of said gain vector by the result of said adding procedure P2; a multiplying part P4 for multiplying the complex conjugate of said final array output by said adaptive gain; a plurality of multiplying parts P5 for multiplying each element of said signal vector (x) by the result of said multiplying part P4; and a plurality of adding parts P6 for adding each output of said multiplying parts P3 to the corresponding output of said multiplying parts P5.

The outputs of the plural adding parts P6 form the final output of said gain vector updating part at each snapshot.

The above-described procedures can also be implemented by means of software in a computing system as well as by means of hardware.

The entire procedure can be summarized on a step-by-step basis as follows.

The gamma (γ) is multiplied by said adaptive gain ($\mu$) (first step) .The result of said P1 is subtracted from 1 (second step) . The present value of each element of said gain vector is multiplied by the result of P2 (third step) . The complex conjugate of the present value of said final array output (y) is multiplied by said adaptive gain ($\mu$) (fourth step). Each element of said signal vector at the present snapshot is multiplied by the result of P4 (fifth step) . And each result of said P3 is added to each result of said P5, and thus, said gain vector is updated by $w\leftarrow(1-\mu\gamma)w+\mu y^*x$ (sixth step).

Figure 3B:
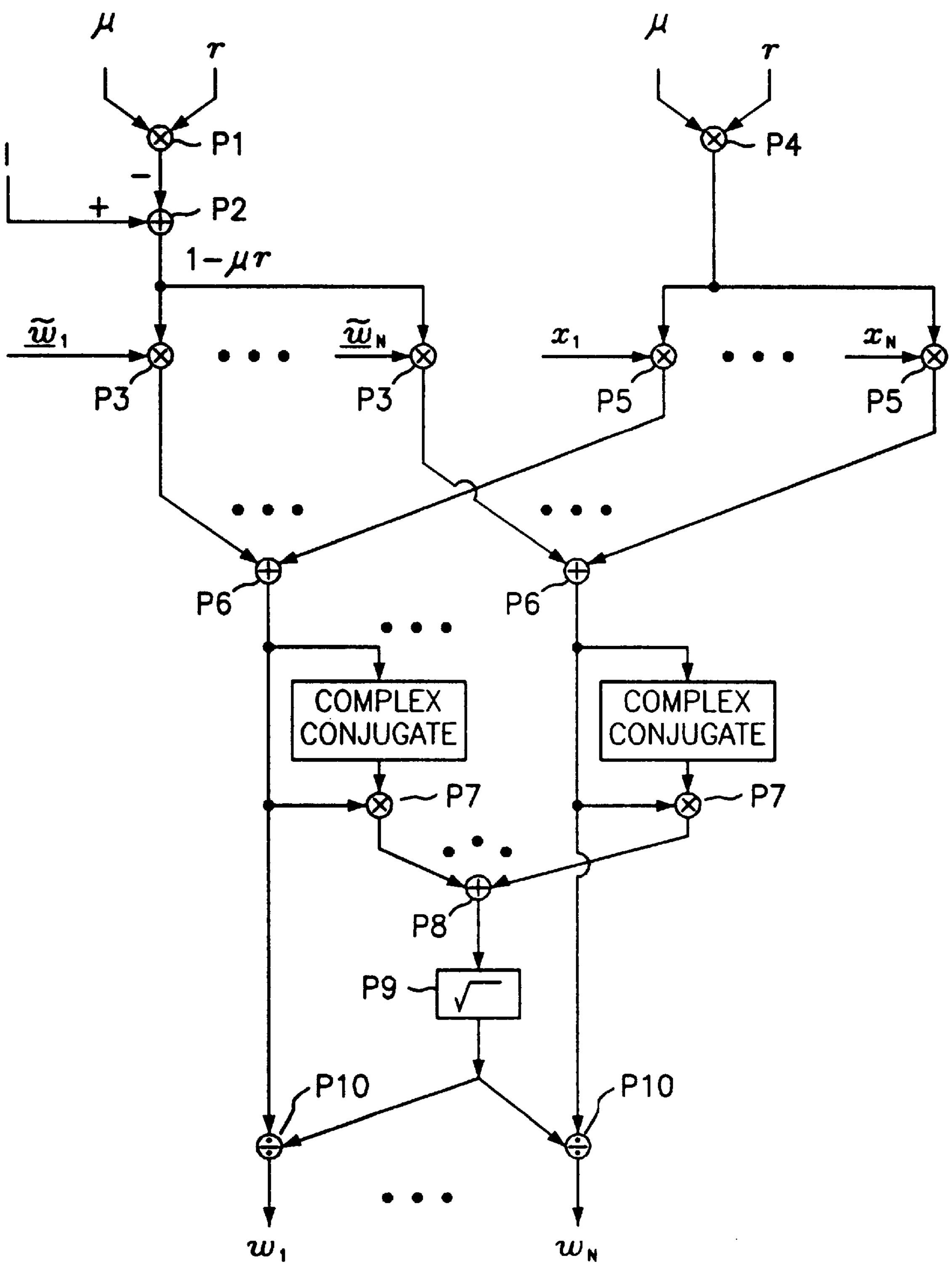
FIG. 3B is an another example of the specified structure of the gain vector updating part shown in FIG. 1.

FIG. 3*b* illustrates another example of the specified structure of the gain vector updating part 12, which is a part of said signal processing apparatus shown in FIG. 1.

The gain vector updating part shown in FIG. 3*b* includes procedures for normalizing the resultant gain vector in addition to all the procedures that were in said gain vector updating part shown in FIG. 3*a*.

Since the procedures P1 to P6 are exactly the same as those in FIG. 3*a*, only the additional procedures P7, P8, P9 and P10 for normalization of said gain vector are explained.

As shown in FIG. 3*b*, the gain vector updating part further comprises the following parts: a plurality of multiplying parts P7 for computing the squared value of the magnitude of each output of said adding parts P6; an adding part P8 for adding up all the outputs of said multiplying parts P7; a part of computing square root P9 for obtaining the square root of the result of said P8; and a plurality of dividing parts P10 for dividing each output of said P6 by the result of said P9.

The above-described parts can also be implemented by means of software in a computing system or by means of hardware.

The entire procedure of FIG. 3*b* is for updating the gain vector by $w \leftarrow (1-\mu\gamma)w+\mu y^{*}x$ and then normalizing ear the resultant vector by $$\underline{w} \leftarrow \frac{w}{\|\underline{w}\|}.$$

Therefore, the magnitude of the gain vector produced in accordance with FIG. 3*b* is always normalized to be 1.

EMBODIED EXAMPLE 2

Here, another example of implementing a signal processing apparatus is introduced which computes the gain vector in real-time in order to generate the optimal beam pattern in the telecommunication system that employs the array antenna system. In this example, the autocorrelation matrix is computed with the signal vectors based on equation (4). By adopting a proper value for the forgetting factor, the autocorrelation matrix is updated at each snapshot. As mentioned previously, the gain vector is obtained from equation (14).

Although the complexity of the signal processing technique disclosed in this example is a little heavier than that of the first example, the performance is a little better in terms of a SIR or BER improvement. Therefore, the first example can be applied to a relatively simple system, whereas the second example can be applied to a larger system that requires more accuracy. The implementation of the signal processing apparatus is explained in detail as the second embodied example as follows.

Figure 4:
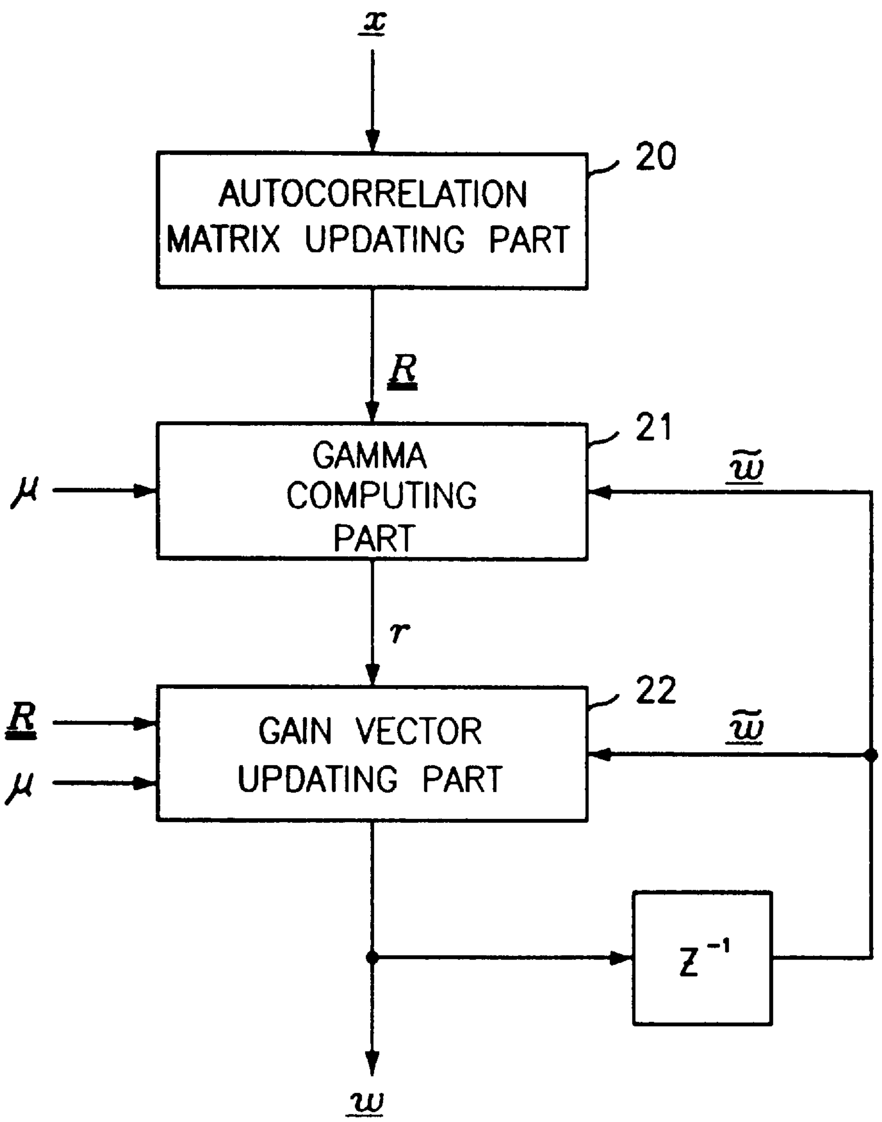
FIG. 4 is a block diagram of the signal processing apparatus according to the second embodiment of the present invention.

FIG. 4 is a block diagram of the signal processing apparatus according to an embodiment of the present invention.

The signal processing apparatus according to the second embodiment of the present invention comprises an autocorrelation matrix updating part 20, a gamma computing part 21 and a gain vector updating part 22.

The autocorrelation matrix updating part 20 computes a new value for the autocorrelation matrix at each snapshot upon the reception of a new signal vector (x) each element of which is obtained from the signal induced at the corresponding antenna element of the array system at every snapshot.

The gamma computing part 21 computes the value for gamma($\gamma$) by utilizing said autocorrelation matrix (R) said adaptive gain($\mu$) and the present value of said gain vector (w).

The gain vector updating part 22 updates the gain vector by utilizing said gamma($\gamma$), the autocorrelation matrix (R), the adaptive gain($\mu$) and the present value of said gain vector(w).

Figure 6A:
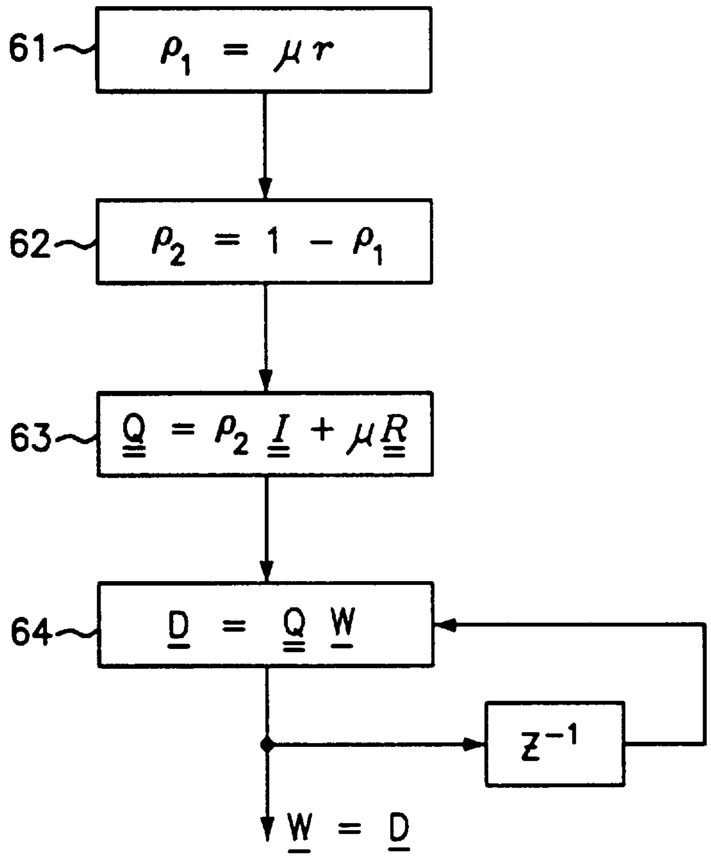
FIG. 6A is a functional block diagram of the gain vector updating part shown in FIG. 4.
Figure 6B:
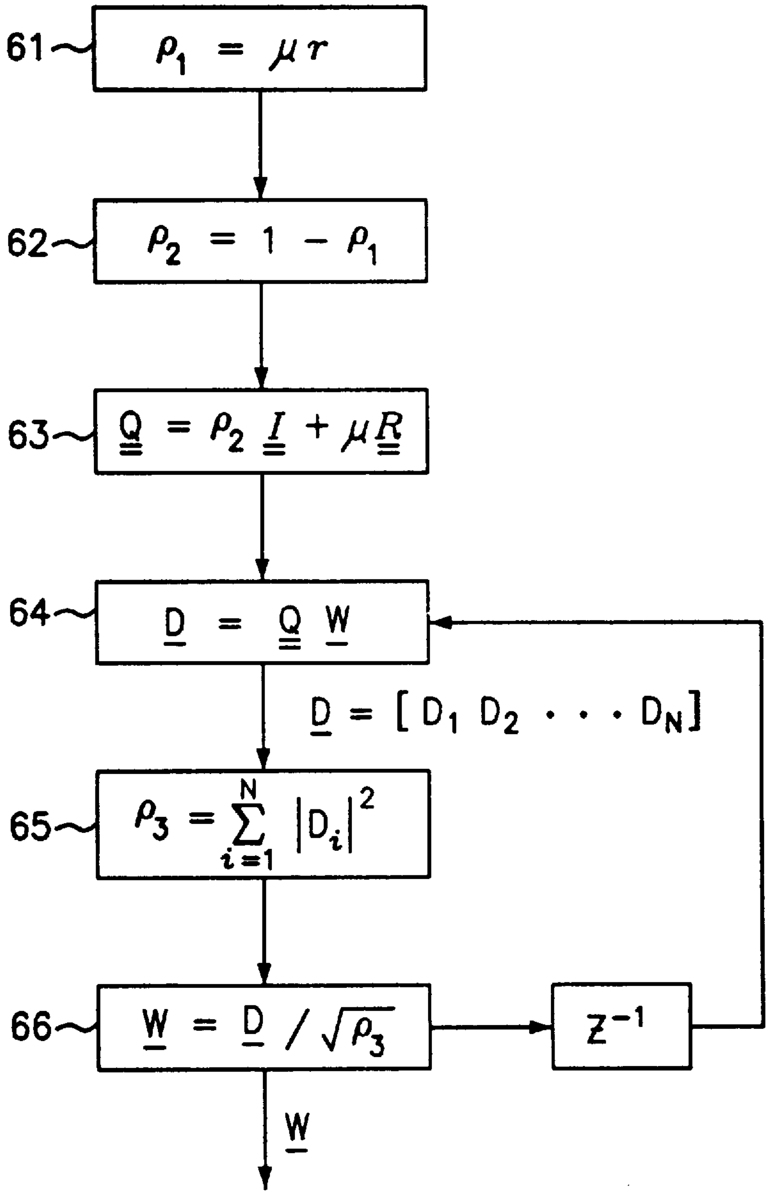
FIG. 6B is another functional block diagram of the gain vector updating part shown in FIG. 4.

As mentioned previously, every part included in the signal processing apparatus shown in FIG. 4 can be implemented by means of software in a computing system as well as hardware. The details in each part of the signal processing apparatus are shown in FIGS. 5, 6*a* and 6*b*.

FIG. 5 is a functional block diagram of the gamma computing part, illustrated in FIG. 4, according to an embodiment of the present invention.

The gamma computing part according to the second embodiment of the present invention computes the value for said gamma by utilizing the autocorrelation matrix, the present value of the gain vector and the adaptive gain through a computational procedure described as follows.

Each row of the autocorrelation matrix is multiplied by the present value of said signal vector to produce a vector E, i.e., E=R w (first step, 51). The complex conjugate of each element of the gain vector is multiplied by the corresponding element of E, i.e., $\lambda = w^H E$ (second step, 52). The $L_2$-norm of the vector E is computed, i.e., $F=E^H E$ (third step, 53). Two-times of the reciprocal of the adaptive gain is multiplied by $\lambda$i.e., $$G = \frac{2}{\mu}\lambda$$

G =2 A (fourth step, 54). The reciprocal of the adaptive gain is added to $\lambda$, i.e., $$A = \frac{1}{\mu} + \lambda$$

(fifth step, 55). The squared value of A is computed, i.e., $C=A^2$(sixth step, 56). F is added to G, i.e., B=F+G (seventh step, 57). And, the gamma is computed by $\gamma = A - \sqrt{C-B}$ (eighth step, 58).

FIG. 6*a* is a functional block diagram of the gain vector updating part, illustrated in FIG. 4, according to an embodiment of the present invention.

The gain vector updating part according to the second embodiment of the present invention updates the value for the gain vector by utilizing the autocorrelation matrix, the present value of the gain vector, and the adaptive gain through a computational procedure described as follows.

The adaptive gain is multiplied by the gamma, i.e., $\rho_1 = \mu\gamma$ (first step, 61). The result of the first step 61 is subtracted from 1, i.e., $\rho_2 = 1-\rho_1$ (second step, 62). The result of the second step 62 is added to the main diagonal elements of matrix $\mu$R to produce resultant matrix Q. i.e., $Q=\rho_2 I + \mu R$ (third step, 63). And, the gain vector is updated by $w \leftarrow Q\,w$ (fourth step, 64).

FIG. 6*b* is a functional block diagram of the gain vector updating part, illustrated in FIG. 4, according to an embodiment of the present invention.

The gain vector updating part shown in FIG. 6*b* includes normalization procedures in addition to what is included in the gain vector updating part shown in FIG. 6*a*.

The gain vector updating part according to the second embodiment of the present invention updates the value for the gain vector by utilizing the autocorrelation matrix, the present value of the gain vector, and the adaptive gain through a computational procedure described as follows.

The adaptive gain is multiplied by the gamma, i.e., $\rho_1 = \mu\gamma$ (first step, 61). The result of the first step 61 is subtracted from 1, i.e., $\rho_2 = 1-\rho_2$ (second step, 62). The result of the second step 62 is added to the main diagonal elements of matrix $\mu$R to produce resultant matrix Q. i.e., $Q=\rho_2 I+\mu R$ (third step, 63). The Q matrix is multiplied by the present value of the gain vector, i.e., D=Q w (fourth step, 64). The magnitude of each element of the vector D is squared and the results of the squaring are added up together, i.e., $$\rho_3 = \sum_{i=1}^{N} |D_1|^2$$

(fifth STEP, 65). And, the vector D is divided by $\rho_3$ to produce the updated gain vector, i.e., $$\underline{w} \leftarrow \frac{D}{\sqrt{\rho_3}}$$

(sixth step, 66).

The gain vector produced in FIG. 6*b* is normalized for the magnitude of the resultant gain vector to be 1 at each snapshot.

Figure 7:
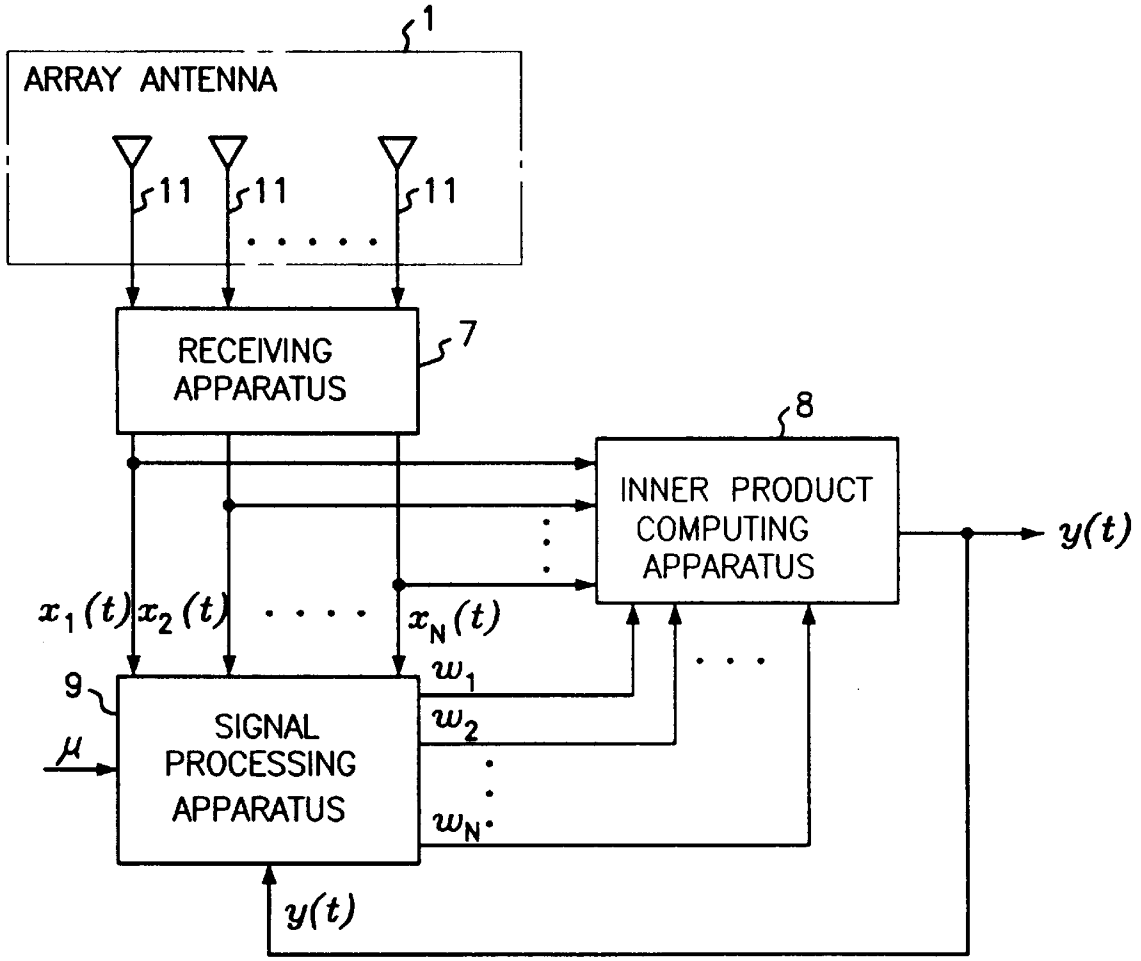
FIG. 7 shows a schematic block diagram of a telecommunication system that utilizes the signal processing apparatus according to the present invention shown in FIG. 1 or 4.

FIG. 7 shows a schematic block diagram of a telecommunication system that utilizes the signal processing apparatus according to the present invention shown in FIG. 1 or 4.

In FIG. 7, the reference number 1 denotes an array antenna, 7 a receiving apparatus, 8 an inner product computing apparatus (which is sometimes denoted as the part of generating the final array output), and 9 the signal processing apparatus according to the present invention, respectively.

As illustrated in the figure, the telecommunication system comprises the following parts: the array antenna 1 (or, called simply, "array", "antenna array", or, "array of antenna elements"), composed of the plural antenna elements 11, each of which is arranged by a predetermined geometry, that supplies the signal induced at each antenna element to the corresponding port of the receiving apparatus 7; the signal receiving apparatus 7 that generates the signal vector (x(t)) from the signals induced at each antenna element of the antenna array 1 by utilizing the proper signal-receiving parts, such as filtering, frequency-down-conversion and demodulation (or, quasi-quadrature detection); the inner product computing apparatus 8 for generating the final array output (y(t)) by computing the Euclidean inner product between the two complex-valued vectors, ($y(t)=w^Hx(x(t))$, i.e., the signal vector (x(t)) produced from the receiving part 7 and the gain vector (w) provided from the signal processing apparatus 9; and the signal processing apparatus 9 that computes the gain vector (w) by processing the signal vector (x(t)) together with the final array output (y(t)) obtained at the last previous snapshot for the inner product computing apparatus 8 to generate the final array output (y(t)) at the present snapshot.

The telecommunication system consists of the receiving apparatus 7, the signal processing apparatus 9 and the inner product computing apparatus 8 for generating the final array output. The receiving apparatus generates the signal vector (x(t)) from the signals induced at the antenna elements 11 through a conventional signal reception part, such as a frequency-down-conversion and demodulation (or quasi-quadrature detection).

When the technique provided in this invention is applied in the CDMA (Code Division Multiple Access) system, the receiving apparatus 7 includes a cross-correlation part for cross-correlating the received signal with the code sequence assigned to the wanted signal source. The signal vector (x(t)) obtained from the receiving apparatus 7 is sent to the signal processing apparatus 9 and the inner product computing apparatus 8.

The signal processing apparatus 9 produces the optimal gain vector (w), which is sometimes referred to as the "weight vector", from the signal vector (x(t)) at the present snapshot and the final array output (y(t)) computed at the last previous snapshot. The optimal weight vector (w) is sent to the inner product computing apparatus for the final array output (y(t)) of the next snapshot to be computed as a result of the inner product of the signal vector (x(t)) and weight vector (w), i.e., $y(t)=w^Hx(t)$.

The key part of the telecommunication system shown in FIG. 7 is the signal processing apparatus 9 producing the optimal weight vector (x(t)), which gives the array antenna system the optimal beam pattern having its maximum gain along the direction of the wanted signal source and small gain to the direction of the interfering signal sources.

As mentioned earlier, the signal processing apparatus or signal processing technique provided in this invention gives the following advantages: first, the communication capacity is increased as much as the signal-to-interference ratio is increased, and second, the communication quality is enhanced as much as the signal-to-noise ratio and the signal-to-interference ratio is increased. The best feature of the proposed technique in this invention is that the required amount of computation to achieve all the merits is extremely small so that the proposed technique can be easily implemented with the normal digital signal processor in real-time processing.

Although the specific embodiments of the present invention have been disclosed and described, it is apparent that those who skilled in the art will appreciate that various modifications, additions and substitutions are possible, without departing from the scope and the spirit of the present invention as disclosed in the accompanying claims. Therefore, it should be understood that the present invention is not limited to the particular embodiment disclosed herein as the best mode contemplated for carrying out the present invention.

What is claimed is:

1. A signal processing apparatus for minimizing interference and for reducing effects of noise by controlling beam patterns of a telecommunication system having an array antenna, comprising:

a means for computing a parameter, gamma (γ(k)), by utilizing a predetermined adaptive gain ($\mu$), a signal vector (x(t)), each element of which is obtained from received signals at a corresponding antenna element and a final array output signal (y(t)) at the present snapshot; and a means for updating a gain vector (w) by utilizing said gamma (γ(k)), the present value of said gain vector (w), said adaptive gain ($\mu$), said signal vector(x(t)) and said final array output(y(t)).

2. The signal processing apparatus according to claim 1, wherein said gain vector (w) is determined by a value of an eigenvector corresponding to the maximum eigenvalue of an autocorrelation matrix of the signals received at each antenna element of said array antenna.

3. The signal processing apparatus according to claim 2, wherein said gain vector (w) is determined by multiplying a predetermined constant on each element of said eigenvector corresponding to said maximum eigenvalue of said autocorrelation matrix, in order to modify said gain vector without changing beam-pattern characteristics of said eigenvector of said maximum eigenvalue.

4. The signal processing apparatus, according to claim 2, wherein said gain vector (w) is determined by normalizing said eigenvector corresponding to said maximum eigenvalue of said autocorrelation matrix, such that a magnitude of the normalized eigenvector becomes 1 and a beam-pattern characteristics of said eigenvector of said maximum eigenvalue remains unchanged.

5. The signal processing apparatus according to claim 2, wherein said autocorrelation matrix is computed by adding a first term and a second term, as shown in the equation given below: (in the equation, said first term is the autocorrelation matrix at the last previous snapshot multiplied by a forgetting factor, of which the magnitude is between 0 and 1, and said second term is a signal matrix computed with said signal vector (x(t)) obtained from each antenna element of said array antenna at the present snapshot.)

$$R_x(J+1)=fR_x(J)+x((J+1)T_s)x^H((J+1)T_s)$$

where $R_x(J+1)$ and $R_x(J)$ denote said autocorrelation matrix at the J+1__st and J__th snapshots, respectively, f is said forgetting factor of which the magnitude lies between 0 and 1, $T_s$ is a snapshot period and superscript H denotes a Hermitian operator.

6. The signal processing apparatus according to claim 5, wherein said forgetting factor in forming said autocorrelation matrix is set to be 0 for simplifying the entire procedure.

7. The signal processing apparatus according to claim 2, wherein said eigenvector corresponding to said maximum eigenvalue is computed by the procedures of:

(a) determining said gain vector with a normalized value of the received signal vector (x(0)), wherein the phase of each element of said signal vector is modified in such a way that the resultant array output is synchronized to the phase of the signal received at said reference antenna element during the first snapshot; and (b) updating said gain vector of the last previous snapshot in such a way that a predetermined cost function, $f(\omega)=\omega^H R_x\omega+\gamma(1-W^H W)$, is maximized satisfying a constraint $|\omega(k)|^2=1$ at each snapshot, and a gain value to be multiplied to said signal received at said reference antenna element at each snapshot is maintained to be a real quantity during the second snapshot and on.

8. The signal processing apparatus according to claim 7, wherein said reference antenna element is determined by an antenna element of which the phase of said signal is the latest of all said antenna elements in said array antenna at the present snapshot.

9. The signal processing apparatus according to claim 7, wherein said reference antenna element is determined by said antenna element of which the physical distance from a signal source to be communicated with at the present snapshot is farthest compared to the other antenna elements in said array antenna.

10. The signal processing apparatus according to claim 1, wherein said means for computing said gamma (γ) comprises:

a first multiplying means for computing the squared value of the magnitude of the final array output (y(t));

a first adding means for adding the result of the first multiplying means to the reciprocal ($1/\mu$) of said adaptive gain;

a second multiplying means for computing the squared value of A, where A denotes the result of the first adding means;

a plurality of multiplying means G4 for computing the squared value of the magnitude of each element of said signal vector(x);

a second adding means for adding up all the results of said multiplying means;

a third adding means for adding the result of the second adding means to two-times ($2/\mu$) the reciprocal ($1/\mu$) of said adaptive gain ($\mu$);

a third multiplying means for multiplying the result of the third adding means by the result ($|y|^2$) of the first multiplying means;

a fourth adding means for subtracting B from the result $A^2$ of the second multiplying means, where B denotes the result of the third multiplying means;

a means for computing a square root for generating the square root of the result of the fourth adding means; and a fifth adding means for subtracting the result of said square-root-computing means from the result of the first adding means to generate the value of the gamma by $\gamma(k)=a-\sqrt{a^2-b}$ where $a=1/\mu+|y(k)|^2$, $b=|y(k)|^2[\|x(k)\|^2+2/\mu]$.

11. The signal processing apparatus according to claim 1, wherein said means for updating said gain vector (ω) comprises:

a first multiplying means for multiplying said gamma γ by said adaptive gain ($\mu$);

a first adding means for subtracting the result of the first multiplying means from 1;

a plurality of multiplying means for multiplying the present value of each element of said gain vector by the result of the first adding means;

a second multiplying means for multiplying the complex conjugate ($y^*$) of said final array output by said adaptive gain;

a plurality of multiplying means for multiplying each element of said signal vector by the result of the second multiplying means; and a plurality of adding means for adding each output of said multiplying means to the corresponding output of said multiplying means to provide the final output of said gain vector updating means at each snapshot as $\omega\leftarrow(1-\mu\gamma)\omega+\mu y^* x$.

12. The signal processing apparatus according to claim 11, wherein the means of updating said gain vector further comprises:

a plurality of multiplying means for computing the squared value of the magnitude of each output of said adding means;

an adding means for adding up all the outputs of said multiplying means;

a means for computing square root of the result of said adding means; and a plurality of dividing means for dividing each output of said adding means by the result of said square-root computing means to generate a normalized value for the gain vector as $$\underline{w}\leftarrow\frac{w}{\|\underline{w}\|}.$$

13. A signal processing method for minimizing interference and reducing effects of noise by controlling beam patterns of a telecommunication system having an array antenna, comprising the steps of:

(a) computing gamma (γ) by utilizing said adaptive gain ($\mu$), said signal vector (x) and said final array output signal (y) at the present snapshot; and (b) updating gain vector (w) by utilizing said gamma, the present value of said gain vector, said adaptive gain, said signal vector and said final array output.

14. The signal processing method according to claim 13, wherein the step of (a) computing said gamma (γ) comprises the following substeps of:

(a-1) computing the squared value of the magnitude of said final array output;

(a-2) adding the reciprocal ($1/\mu$) of said adaptive gain ($\mu$) to the result of said substep (a-1);

(a-3) computing the squared value of the result (A) of said substep (a-2);

(a-4) computing the squared value of the magnitude of each element of said signal vector (x);

(a-5) adding up all the results of said substep (a-4);

(a-6) adding the result of said substep (a-5) to the multiplication of the reciprocal of said adaptive gain ($\mu$) by 2, i.e., ($2/\mu$);

(a-7) multiplying the result of said substep (a-6) by the result ($|y|^2$) of said substep (a-1), (a-8) subtracting the result (B) of said substep (a-7) from the result ($A^2$) of said substep (a-3);

(a-9) computing the square root of the result of said substep (a-8); and (a-10) subtracting the result of said substep (a-9) from the result of said substep (a-2), and thus, the resultant value of said gamma is produced as $\gamma=A-\sqrt{A^2-B}$.

15. The signal processing method according to claim 13, wherein the step of (b) updating said gain vector comprises the following substeps of:

(b-1) multiplying said gamma ($\gamma$) by said adaptive gain ($\mu$)

(b-2) subtracting the result of said substep (b-1) from 1;

(b-3) multiplying the present value of each element of said gain vector by the result of said substep (b-2);

(b-4) multiplying the complex conjugate of the present value of said final array output (y) by said adaptive gain ($\mu$);

(b-5) multiplying each element of said signal vector at the present snapshot by the result of said substep (b-4); and (b-6) adding each result of said substep (b-3) to each result of said substep (b-5), and thus, said gain vector is updated by $\omega\leftarrow(1-\mu\gamma)\omega+\mu y^*x$.

16. The signal processing method according to claim 13, wherein the step of (b) updating said gain vector comprises the following substeps of:

(b-1) multiplying said gamma ($\gamma$) by said adaptive gain ($\mu$);

(b-2) subtracting the result of said substep (b-1) from 1;

(b-3) multiplying the present value of each element of said gain vector by the result of said substep (b-2);

(b-4) multiplying the complex conjugate of the present value of said final array output (y) by said adaptive gain ($\mu$);

(b-5) multiplying each element of said signal vector at the present snapshot by the result of said substep (b-4);

(b-6) adding each result of said substep (b-3) to each result of said substep (b-5);

(b-7) computing the squared value of the magnitude of each output of said substep (b-6);

(b-8) adding up all the outputs of said squared values;

(b-9) computing the square root of the result of substep (b-2); and (b-10) dividing each output of said substep (b-6) by the result of substep (b-9) to generate $$\underline{w}\leftarrow\frac{w}{\|\underline{w}\|}.$$

17. A signal processing apparatus for minimizing interference and for reducing effects of noise by controlling beam patterns of a telecommunication system having an array antenna, comprising:

a means for generating an autocorrelation matrix (R) of received signals by utilizing said signal vector (x) at every snapshot;

a means for computing said gamma ($\gamma$) by utilizing said adaptive gain ($\mu$), the present value of said gain vector (w) and said autocorrelation matrix (R) at each snapshot; and a means for updating said gain vector (w) by utilizing said gamma ($\gamma$), the present value of said gain vector (w), said adaptive gain ($\mu$) and said autocorrelation matrix (R).

18. The signal processing apparatus according to claim 17, wherein said gain vector (w) is determined by a value of an eigenvector corresponding to the maximum eigenvalue of an autocorrelation matrix of the signals received at each antenna element of said array antenna.

19. The signal processing apparatus according to claim 18, wherein said gain vector (w) is determined by multiplying a predetermined constant to each element of said eigenvector corresponding to said maximum eigenvalue of said autocorrelation matrix, in order to modify said gain vector without changing beam-pattern characteristics of said eigenvector of said maximum eigenvalue.

20. The signal processing apparatus according to claim 18, wherein said gain vector (w) is determined by normalizing said eigenvector corresponding to said maximum eigenvalue of said autocorrelation matrix, such that the magnitude of the normalized eigenvector becomes 1 and a beam-pattern characteristics of said eigenvector of said maximum eigenvalue remains unchanged.

21. The signal processing apparatus according to claim 18, wherein said autocorrelation matrix computing part (20) computes the autocorrelation matrix by adding a first term and a second term, as shown in the equation given below: (in the equation, said first term is the autocorrelation matrix at the last previous snapshot multiplied by a forgetting factor of which the magnitude is between 0 and 1, and said second term is a signal matrix computed with said signal vector (x(t)) obtained from each antenna element of said array antenna at the present snapshot.)

$$R_x(J+1)=f\cdot R_x(J)+x((J+1)T_s)x^H((J+1)T_s)$$

where $R_x(J+1)$ and $R_x(J)$ denote said autocorrelation matrix at the J+1__st and J__th snapshots, respectively, f is said forgetting factor of which the magnitude lies between 0 and 1, $T_s$ is a snapshot period and superscript H denotes a Hermitian operator.

22. The signal processing apparatus according to claim 18, wherein said eigenvector corresponding to said maximum eigenvalue is computed by the procedures of:

(a) determining said gain vector with a normalized value of the received signal vector (x(0)), wherein the phase of each element of said signal vector is modified in such a way that the resultant array output is synchronized to the phase of the signal received at said reference antenna element during the first snapshot; and (b) updating said gain vector of the last previous snapshot in such a way that a predetermined cost function, $f(\omega)=\omega^H R_x\omega+\gamma(1-W^H W)$, is maximized satisfying a constraint $|\omega(k)|^2=1$ at each snapshot, and a gain value to be multiplied to said signal received at said reference antenna element at each snapshot is maintained to be a real quantity during the second snapshot and on.

23. The signal processing apparatus according to claim 22, wherein said reference antenna element is determined by an antenna element of which the phase of said signal is the latest of all said antenna elements in said array antenna at the present snapshot.

24. The signal processing apparatus according to claim 22, wherein said reference antenna element is determined by said antenna element of which the physical distance from a signal source to be communicated with at the present snapshot is farthest compared to the other antenna elements in said array antenna.

25. The signal processing apparatus according to claim 17, wherein said gamma computing part comprises:

a first multiplying means for multiplying each row of the autocorrelation matrix by the present value of said signal vector to produce a vector E, i.e., E=R ω; a second multiplying means for multiplying the complex conjugate of each element of the gain vector by the corresponding element of E, i.e., $\lambda=\omega^H$ E;

a first computing means for computing the $L_2$-norm of the vector E, i.e., $F=E^H$ E;

a third multiplying means for multiplying two-times of the reciprocal of the adaptive gain by λ, i.e., $G=2/\mu\lambda$;

a first adding means for adding the reciprocal of the adaptive gain to λ, i.e., $A=1/\mu+\lambda$;

a second computing means for computing the squared value of A, i.e., $C=A^2$;

a second adding means for adding the F to the G, i.e., B=F+G; and a third computing means for computing the gamma by $\gamma=A-\sqrt{C-B}$.

26. The signal processing apparatus according to claim 17, wherein said gain vector updating part comprises:

a first multiplying means for multiplying the adaptive gain by said gamma, i.e., $\rho_1=\mu\gamma$;

a subtracting means for subtracting the result of said first multiplying means from 1, i.e., $\rho_2=1-\rho_2$;

a adding means for adding the result of said subtracting means to the main diagonal elements of a matrix γ R to produce a matrix Q, i.e., $Q=\rho_2 I+\mu$ R, where I denotes the identity matrix; and a second multiplying means for multiplying the matrix Q by the present value of the gain vector ω to produce the updated gain vector by ω←Q ω.

27. The signal processing apparatus according to claim 17, wherein said gain vector updating part comprises:

a first multiplying means for multiplying the adaptive gain by the gamma, i.e., $\rho_1=\mu\gamma$;

a subtracting means for subtracting the result of said first multiplying means from 1, i.e., $\rho_2=1\rho_2$;

a means for adding the result of said subtracting means to the main diagonal elements of a matrix μ R to produce resultant matrix Q, i.e., $Q=\rho_2 I+\mu$ R, where I denotes the identity matrix;

a second multiplying means for multiplying the Q matrix by the present value of the gain vector, i.e., D=Q ω;

a means for computing the $L_2$-norm of the vector D, i.e., $$\rho_3=\sum_{i=1}^{N}|D_i|^2;$$

and a means for dividing the vector D by $\rho_3$ to produce the updated gain vector, i.e., $$\underline{w}\leftarrow\frac{D}{\sqrt{\rho_3}}.$$

28. A signal processing method for minimizing interference and for reducing effects of noise by controlling beam patterns of a telecommunication system having an array antenna, comprising the steps of:

(a) generating an autocorrelation matrix (R) of received signals by utilizing said signal vector (x) at every snapshot;

(b) computing gamma (γ) by utilizing said adaptive gain (μ), the present value of gain vector (w) and autocorrelation matrix (R) at each snapshot; and (c) updating said gain vector (w) by utilizing said gamma (γ), the present value of said gain vector (w), said adaptive gain (μ) and said autocorrelation matrix (R).

29. The signal processing method according to claim 28, wherein the step of (b) computing said gamma comprises the substeps of:

(b-1) multiplying each row of the autocorrelation matrix by the present value of said signal vector to produce a vector E, i.e., E=R ω;

(b-2) multiplying the complex conjugate of each element of the gain vector by the corresponding element of E, i.e., $\gamma=\omega^H E$;

(b-3) computing the $L_2$-norm of the vector E, i.e., $F=E^H E$;

(b-4) multiplying two-times of the reciprocal of the adaptive gain by γ, i.e., $G=2/\mu\gamma$;

(b-5) adding the reciprocal of the adaptive gain to γ, i.e., $A+1/\mu=\gamma$;

(b-6) computing the squared value of A, i.e., $C=A^2$;

(b-7) adding the F to the G, i.e., B=F+G; and (b-8) computing the gamma by $\gamma=A-\sqrt{C-B}$.

30. The signal processing apparatus according to claim 28, wherein the step of (c) updating said gain vector comprises the substeps of:

(c-1) multiplying the adaptive gain by said gamma, i.e., $\rho_1=\mu\gamma$;

(c-2) subtracting the result of said substep (c-1) from 1, i.e., $\rho_2=1-\rho_1$;

(c-3) adding the result of said substep (c-2) to the main diagonal elements of a matrix μ R to produce a matrix Q, i.e., $Q=\rho_2 I+\mu$ R where I denotes the identity matrix; and (c-4) multiplying the matrix Q by the present value of the gain vector ω to produce the updated gain vector by ω←Q ω.

31. The signal processing apparatus according to claim 28, wherein the step of (c) updating said gain vector comprises the substeps of:

(c-1) multiplying the adaptive gain by the gamma, i.e., $\rho_1=\mu\gamma$, (c-2) subtracting the result of said substep (c-1) from 1, i.e., $\rho_2=1+\rho_1$ ;

(c-3) adding the result of said substep (c-2) to the main diagonal elements of a matrix μ R to produce resultant matrix Q, i.e., $Q=\rho_2 I+\mu$ R where I denotes the identity matrix;

(c-4) multiplying the Q matrix by the present value of the gain vector, i.e., D=Q ω;

(c-5) computing the $L_2$-norm of the vector D, i.e., $$\rho_3=\sum_{i=1}^{N}|D_i|^2;$$

and (c-6) dividing the vector D by $\rho_3$ to produce the updated gain vector, i.e., $$\underline{w}\leftarrow\frac{D}{\sqrt{\rho_3}}.$$

* * * * *